(12) United States Patent
Nowak et al.

(10) Patent No.: US 6,366,346 B1
(45) Date of Patent: Apr. 2, 2002

(54) METHOD AND APPARATUS FOR OPTICAL DETECTION OF EFFLUENT COMPOSITION

(75) Inventors: Thomas Nowak, Sunnyvale; Sebastien Raoux, San Francisco; Dave Silvetti, Morgan Hill; Stefan Wolff, Sunnyvale; Russ Newman, Santa Clara; Imad Yousif; Ned Matthew, both of San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/196,459

(22) Filed: Nov. 19, 1998

(51) Int. Cl.[7] ............................. G01R 31/00; G01J 5/02
(52) U.S. Cl. ........................ 356/72; 216/60; 250/343
(58) Field of Search ................ 356/316, 72; 216/60; 250/341.4, 343; 156/345

(56) References Cited

U.S. PATENT DOCUMENTS

| | | | |
|---|---|---|---|
| 4,609,810 A | 9/1986 | O'Brien et al. ........ 219/121 PT |
| 4,857,136 A | * 8/1989 | Zajac ........................ 156/345 |
| 4,859,277 A | 8/1989 | Barna et al. ............... 156/626 |
| 5,169,407 A | * 12/1992 | Mase et al. ................. 156/626 |
| 5,288,367 A | 2/1994 | Angell et al. .............. 156/626 |
| 5,308,414 A | 5/1994 | O'Neill et al. ............. 156/626 |
| 5,348,614 A | 9/1994 | Jerbic ........................ 156/626 |
| 5,565,114 A | 10/1996 | Saito et al. ................... 216/60 |
| 5,632,821 A | 5/1997 | Doi ............................. 134/1.1 |
| 5,788,799 A | * 8/1998 | Steger et al. ............... 156/345 |
| 5,871,658 A | * 2/1999 | Tao et al. ..................... 216/60 |
| 5,880,850 A | * 3/1999 | McAndrew et al. ........ 356/437 |

FOREIGN PATENT DOCUMENTS

| | | | |
|---|---|---|---|
| EP | 0 859 250 A1 | 8/1998 | ............ G02B/6/34 |
| WO | WO 99/06610 | 2/1999 | ............ C23C/16/44 |

* cited by examiner

*Primary Examiner*—Frank G. Font
*Assistant Examiner*—Zandra V. Smith
(74) *Attorney, Agent, or Firm*—Townsend & Townsend & Crew

(57) ABSTRACT

A method and apparatus for determining the composition of an effluent stream from a vacuum processing chamber. A cell placed in the effluent stream from the vacuum processing chamber creates a glow discharge from the constituents in the effluent stream. An optical detector measures a particular wavelength corresponding to the presence of a particular species. In one embodiment the output from the optical detector is used to determine the endpoint of a chamber cleaning process.

34 Claims, 15 Drawing Sheets

METHOD AND APPARATUS FOR OPTICAL DETECTION OF EFFLUENT COMPOSITION

BACKGROUND OF THE INVENTION

The present invention relates to monitoring the composition of an effluent stream from processing chambers of the type that may be used in semiconductor wafer fabrication, and more specifically to optically detecting the composition of a plasma formed from the effluent stream from a chamber.

One of the primary steps in fabrication of modern semiconductor devices is the formation of a layer, such as a dielectric, metallic, or semiconductor layer, on a substrate or wafer. As is well known, such layers can be deposited by chemical vapor deposition (CVD), physical vapor deposition (PVD) or other methods. In thermal CVD processes, reactant gases are supplied to the substrate surface where heat-induced chemical reactions take place to produce a desired film.

In a typical plasma-enhanced CVD (PECVD) process, reactant gases are disassociated in a plasma formed by the application of energy, such as radio frequency (RF) energy to a reaction zone near or adjoining the surface of the substrate. This type of plasma is commonly called an in-situ plasma. The plasma, which contains high-energy species such as ions and free radicals, promotes formation of the desired layer. The plasma also typically produces a broad range of radiation from ultraviolet to infrared.

Deposition systems typically accumulate unwanted residue when used to process substrates. Over time, failure to clean the residue from the deposition system can result in degraded or unreliable performance of the deposition system, and in defective wafers. Increasingly stringent requirements for fabricating modern high-integration devices must be met, but conventional substrate processing systems may be inadequate to meet these requirements. Semiconductor device manufacturers may need to replace or improve their existing deposition systems in order to provide the process control and throughput necessary to compete in the manufacture of modern semiconductor devices. An example of an upgraded capability that may be required in deposition systems is the capability to clean the chamber effectively and economically in order to improve quality and overall efficiency in fabricating devices.

Typically, two types of cleaning procedures have been used. "Dry cleaning" processes may be performed between deposition processing steps without disassembling the chamber. A dry cleaning process uses a cleaning gas or a plasma to volatilize residue in the chamber, which is then removed by the exhaust system. A dry clean may be performed after each wafer has been processed, or after several wafers have been processed. "Wet cleans" typically involve opening the processing chamber and physically wiping down the chamber with cleaning fluids. Wet cleans can be quite time-consuming and disruptive of product flow and throughput. Periodic chamber cleaning, however, is critical to process and device performance since possible effects of residue build-up in the chamber include wafer contamination and process drift (e.g., changes in deposition rate) due to changes in chamber thermal and electrical properties. The problems of impurities and particles causing damage to the devices on the wafer are of particular concern because of the increasingly small dimensions of modern devices. Thus, properly cleaning the chamber is important for the smooth operation of wafer processing, improved device yield and better product performance.

In some instances, an in-situ plasma may be used in a dry cleaning process. While some deposition systems, such as thermal CVD systems, may not have the ability to perform this in-situ plasma clean step, PECVD systems typically have chamber components compatible with inter-deposition in-situ plasma cleans. However, the ability to form or maintain an in-situ plasma for cleaning may be limited to certain chamber pressures or other conditions, such as the type of cleaning gas used. Exposure to the in-situ plasma clean may shorten the lifetime of chamber components or degrade subsequent wafer processing. Furthermore, the efficiency of an in-situ plasma cleaning process may depend on the plasma density and distribution, and may clean some areas of the chamber differently than other areas. Therefore, it may be impractical or undesirable to use an in-situ plasma cleaning in all circumstances. Another reason to use remote instead of in-situ plasma cleaning is that emission of global-warming perfluorinated compounds (PFC's) can be lower when using remote plasma cleans.

Remote plasma generating systems have been shown to be useful in cleaning substrate processing chambers. Some remote plasma generating systems use a waveguide to convey microwave energy from a microwave source to an applicator tube, where a precursor gas is converted into a plasma. The plasma is used to dissociate a precursor (e.g., $NF_3$) into chemically active species, such as fluorine radicals, that are transported into the process chamber to react with the deposition residue during the clean process. Using microwave energy to generate the plasma is quite efficient, and often results in higher clean rates than are obtained with an in-situ plasma clean.

It is desirable to know when a dry clean process is complete to maximize wafer throughput, to minimize use of cleaning materials, and to minimize wear and tear of equipment being cleaned, thereby increasing the expected life of hardware and decreasing the frequency of periodic maintenance. Optical endpoint detection methods have been used to determine the endpoint of in-situ plasma clean processes. One type of optical endpoint detection system uses a photo detector to measure the light emitted by the in-situ glow discharge. When a gas is ionized, the plasma will emit radiation over a broad range of wavelengths. The intensity of the emitted radiation varies with wavelength, resulting in a characteristic distribution, or spectrum, of emission peaks versus wavelength. One can identify which molecules or other species are present in the plasma by examining the resulting emission spectrum. Remote plasma cleaning systems, however, cannot use this type of optical endpoint detection because the plasma is generated upstream of the process chamber and, hence, the observed plasma emission spectrum does not reflect changes in chamber chemistry over the course of the cleaning process.

Other methods, such as empirically defining a set "average" cleaning time or observing the cleaning process through a window in the chamber have been used to determine the endpoint of remote plasma cleans. Using a fixed-time clean may result in a cleaning process that is either too short or too long for a particular situation because of changes in cleaning efficiency caused by hardware degradation, changes in operator settings, and slight variations in deposit conditions.

From the above, it can be seen that is desirable to have an efficient and thorough remote plasma cleaning process. It is also desirable to provide an endpoint detect method and apparatus to enhance utilization of the substrate processing equipment and to reduce the overetching of chamber components. The endpoint detection method should provide a reliable indication of the end of the cleaning process under a variety of cleaning conditions.

SUMMARY OF THE INVENTION

The present invention provides a method and an apparatus for determining the composition of the effluent from a process chamber by forming a plasma in the exhaust stream and measuring the optical emissions from that plasma.

In one embodiment, a plasma is formed in a cell using the effluent from a processing chamber. A window transmits light emitted from the plasma to an optical detector. A filter between the observation window and the detector can be used to tune the detector to a particular wavelength of light. The selected wavelength corresponds to a particular component in the plasma. Additional detectors and filters may be added to monitor the presence of additional plasma components. Relative concentrations of a plasma component can be determined by monitoring a single wavelength.

In another embodiment, the presence of free fluorine is monitored during a chamber cleaning process that utilizes fluorine species created from a cleaning precursor gas in a remote microwave plasma generator. The relative concentration of free fluorine in the exhaust stream, indicated by the intensity of photon emissions from the plasma at a characteristic wavelength of fluorine, increases when the chamber cleaning process is completed and the free fluorine is no longer combining with residue in the chamber. After the change in emissions is detected, the cleaning process is ended.

For a further understanding of the objectives and advantages of the present invention, reference should be made to the ensuing detailed description taken in conjunction with the accompanying drawings.

DESCRIPTION OF THE PREFERRED EMBODIMENT

I. AN EXEMPLARY SYSTEM

Figure 1A:
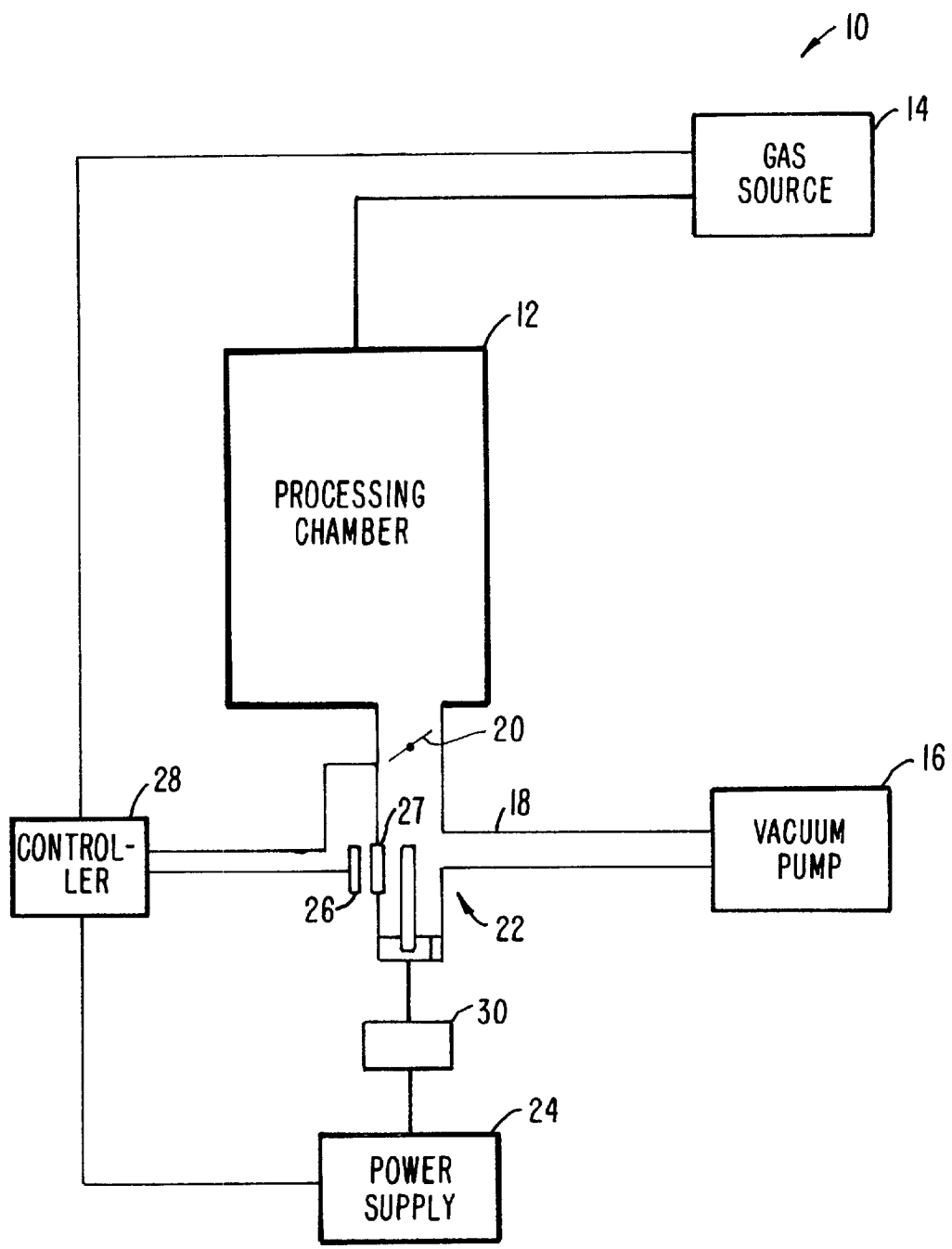
FIG. 1A is a simplified diagram of a processing system with an effluent plasma cell.

FIG. 1A is a simplified diagram of a processing system 10 according to one embodiment of the present invention. A processing chamber 12, such as may be used in the manufacture of semiconductor devices, receives gas or gases from a gas source 14. The processing chamber may be used to form a layer of dielectric material, such as silicon oxide or silicon nitride, a layer of metal, such as aluminum, copper, titanium, platinum, or tungsten, or a layer of semiconductor material, such as silicon, germanium, or a compound semiconductor, on a substrate, such as a silicon wafer or a semiconductor-on-insulator wafer. The terms "oxide" and "nitride" are used to refer to silicon dioxide ($SiO_2$) and silicon nitride ($Si_3N_4$), respectively, although it is understood that materials formed by CVD may not have exact stoichiometric ratios. A vacuum pump 16 connected to the processing chamber with a foreline 18, which is a vacuum conduit, establishes and maintains a pressure in the processing chamber in conjunction with the flow of gas supplied by the gas source. An optional throttle valve 20 can provide further control over the chamber pressure.

Gas is supplied to the processing chamber 12 where the gas typically reacts to form a layer of material on a substrate, or to perform another process, such as an etching or cleaning process. The effluent from the chamber, which may include unreacted gas as well as reaction byproducts, is exhausted from the chamber by the vacuum pump 16 through the foreline 18.

A plasma cell 22 that is energized by a power supply 24 forms a plasma from the effluent in the exhaust stream. A sensor 26 placed outside of a window 27 in the foreline 18 detects the light emitted by the plasma and converts it into a voltage signal(s). The light emitted by the plasma indicates the types and concentrations of substances in the plasma because different substances will emit different wavelengths of light when excited in a plasma and the amplitude of a detected wavelength provides an indication of the amount or concentration of a particular substance in the exhaust stream. The plasma cell is placed just downstream from the throttle valve, thereby minimizing distance from the process chamber while isolating the plasma in the cell from the process chamber.

A controller 28 receives the signal(s) from the sensor 26. The controller can perform calculations and comparisons based on the received signals to control a process parameter or parameters, such as gas flow rates, exhaust rate, chamber processing, substrate temperature, substrate position in the chamber, and plasma energy and/or bias, if appropriate, among other parameters. For example, the controller may shut off a gas flow from the gas source 14 to the processing chamber 12 when signals from the sensor indicate the end of a process has occurred.

The power supply 24 is a commercially available switching power supply of the type used with fluorescent lighting, and is capable of generating about 30 W of power at 31 kHz.

This type of power supply is much less expensive and much more compact than the type of power supplies typically used to generate in-situ plasmas, which often must supply several kilowatts of radio-frequency (RF) power to the processing chamber, typically at much higher frequencies. Additionally, a switching power supply of this type can run off of a standard 110 V, 60 Hz power line, or wall plug, and does not require special facilities. Other types of power supplies may be used, such as an amplifier-oscillator, that would also provide adequate power to the plasma cell from a standard wall plug.

The 31 kHz operating frequency of the commercially available fluorescent lighting ballast is convenient for supplying power to the plasma cell because matching load to source impedances at this frequency is simplified relative to load matching at higher frequencies. Without any load matching, it is estimated that about 12–15 W of power is delivered to the plasma. A matching circuit 30 between the power supply 24 and the plasma cell 22 improves power delivered to the plasma, which may allow the use of an even smaller power supply, or may allow the plasma cell to form a plasma in the foreline 18 over a wider range of operating conditions, such as foreline pressure and effluent composition. A higher operating frequency may be more desirable if ion etching of the plasma cell compromises its operating life.

The operating frequency chosen for an in-situ plasma system must typically balance several factors, such as plasma generation efficiency, plasma uniformity, plasma processing characteristics, electromagnetic interference, and size and cost of the power supply. A common operating frequency is 13.56 MHz, which provides a desirable balance between several factors and is allocated for commercial use by the Federal Communication Commission (FCC). The present invention has a much wider range of choices for operating frequency because the plasma characteristic of interest is the optical emission from the plasma. The plasma may be small and dilute, and a much lower power supply may be used, thus also limiting the undesirable electromagnetic emissions.

Figure 1B:
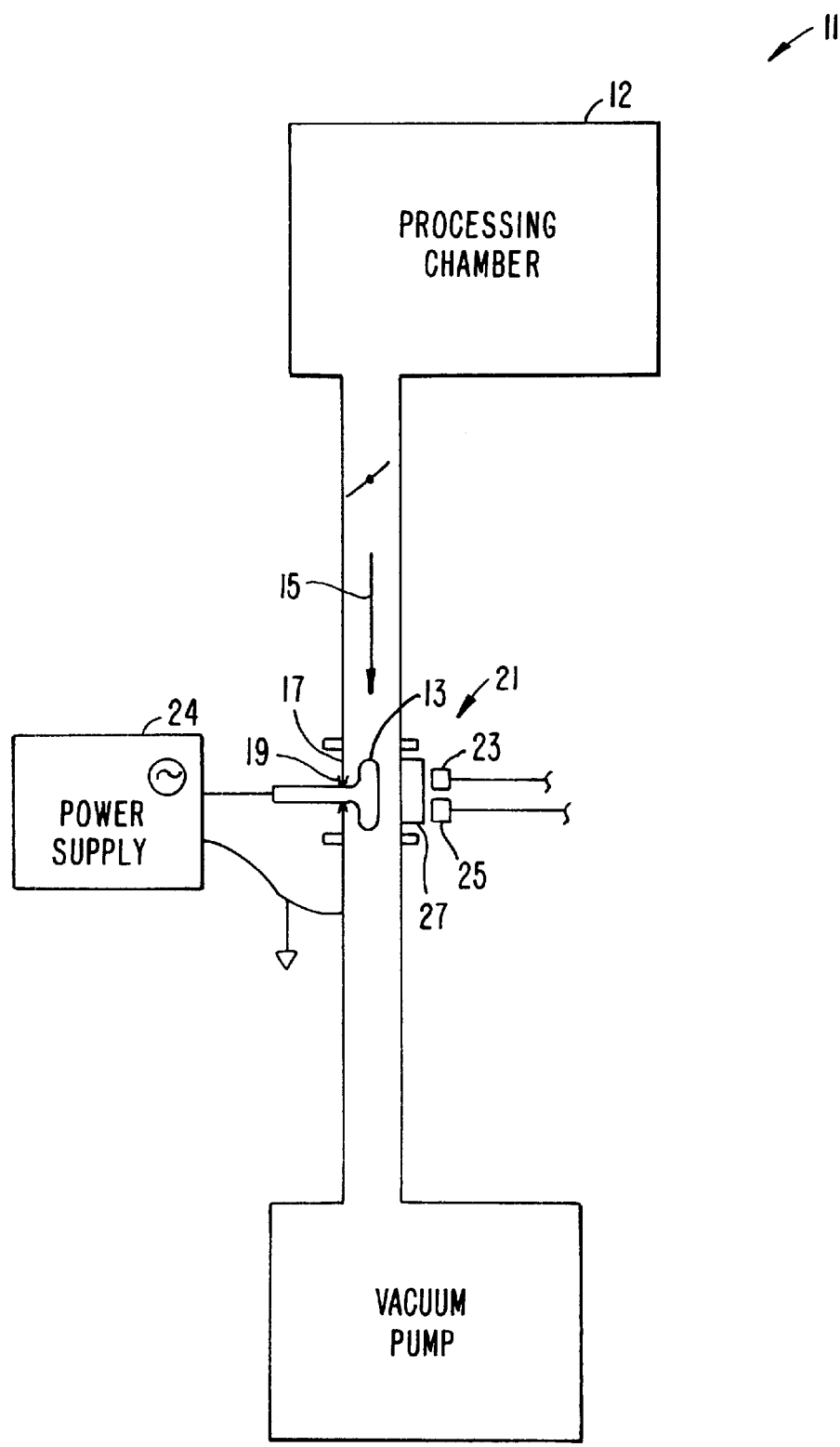
FIG. 1B is a simplified diagram of a substrate processing system having an in-line plasma cell.

FIG. 1B is a simplified diagram of a substrate processing system 11 having an in-line plasma cell 21, according to another embodiment of the present invention. The in-line plasma cell has an elongated cathode 13 substantially co-axial with the exhaust flow, represented by the arrow 15. The cathode is electrically isolated from the conductive wall 17 of the plasma cell by an isolator 19. A power supply 24 is connected to the cathode and the conductive wall of the plasma cell, which forms the anode of the plasma cell. Optical emissions generated in the plasma cell are transmitted through a window 27 to optical sensors 23, 25.

II. PLASMA CELLS

Figure 2A:
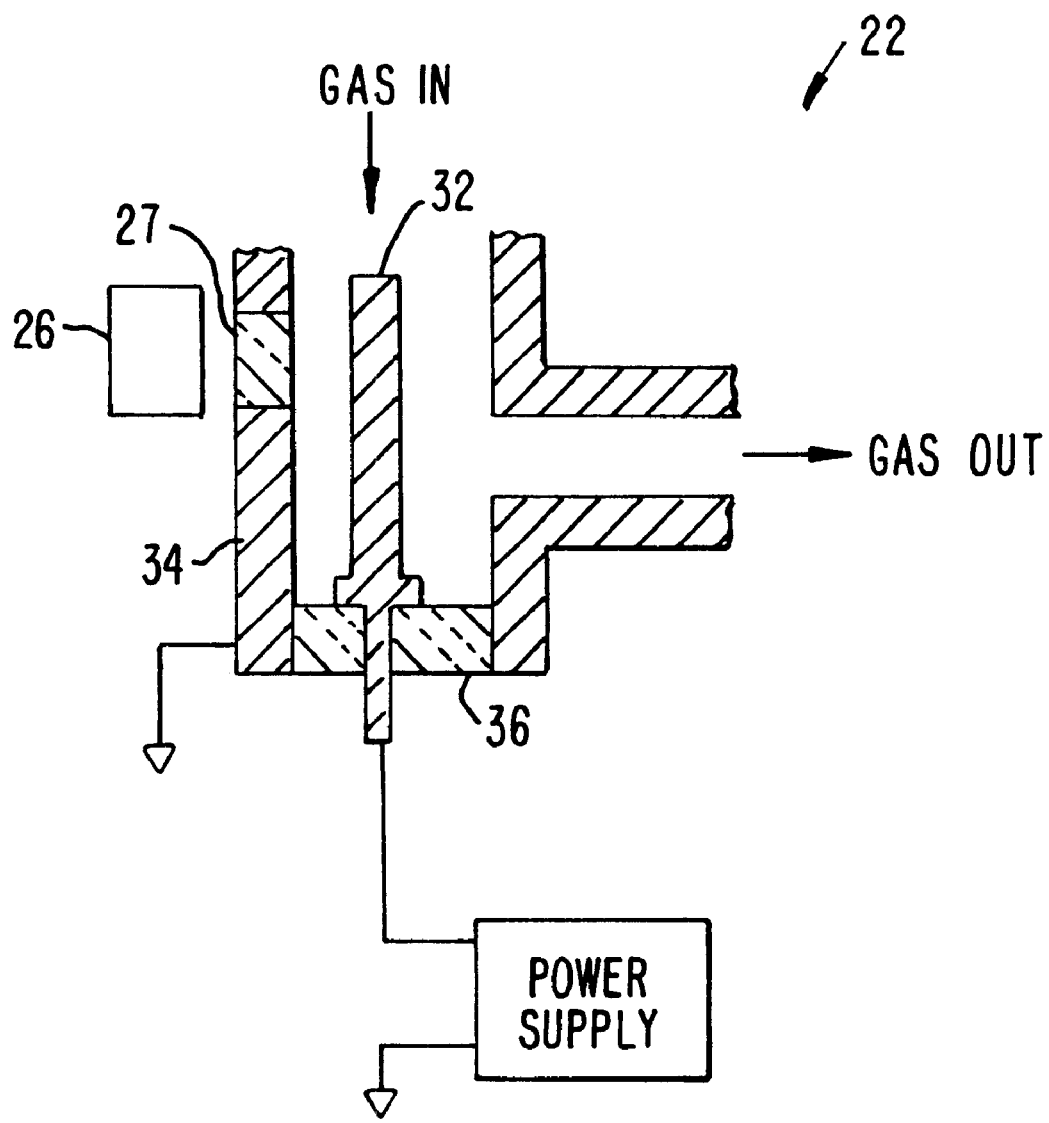
FIG. 2A is a simplified view of one embodiment of a plasma cell.

FIG. 2A is a simplified view of one embodiment of a plasma cell 22. Plasma can be generated by coupling the input energy in various ways (e.g., capacitively, inductively, or in some combination of the two). The example described here generates a capacitively coupled plasma. A cathode 32, which is the powered electrode, is separated from an anode 34, which is the grounded electrode, with an insulating spacer 36. The insulating spacer is made from a material with suitable dielectric breakdown strength that is compatible with the expected environment(s) within the foreline. Suitable materials for the insulating spacer in some applications include acetal resin, polytetrafluoroethelyene, such as TEFLON®, or ceramic. The anode 34 and cathode 32 are made of aluminum, but could be made from a variety of other conductive materials. The cathode 32 is a cylindrical aluminum rod, but could be a filament, wire mesh, or other form. The plasma cell introduces minimal losses in gas flow through the foreline while providing reliable ignition and maintenance of a stable glow discharge plasma.

The configuration of the plasma cell allows use of a small, efficient, simple, and inexpensive power supply to form a plasma with sufficient optical emissions to monitor the effluent composition. Unlike in-situ plasmas, which typically must be physically large and dense to efficiently perform a processing operation within a chamber, the foreline plasma need only be large and dense enough to produce sufficient light to monitor the composition of the exhaust stream and can operate at a selectably low power to control the disassociation of plasma species. The plasma cell can also operate over a wide range of pressures, as the operating pressure is not constrained by the requirements of an in-situ plasma process.

Placing the plasma cell 22 and sensor 26 downstream of the throttle valve 20 causes negligible disruption of the gas flows within the process chamber. Consequently, existing processing systems can be retrofitted with an optical detector and plasma cell. However, a processing system may be designed with the detector and plasma cell further upstream, such as at an exhaust port or exhaust plenum of a chamber.

Figure 2B:
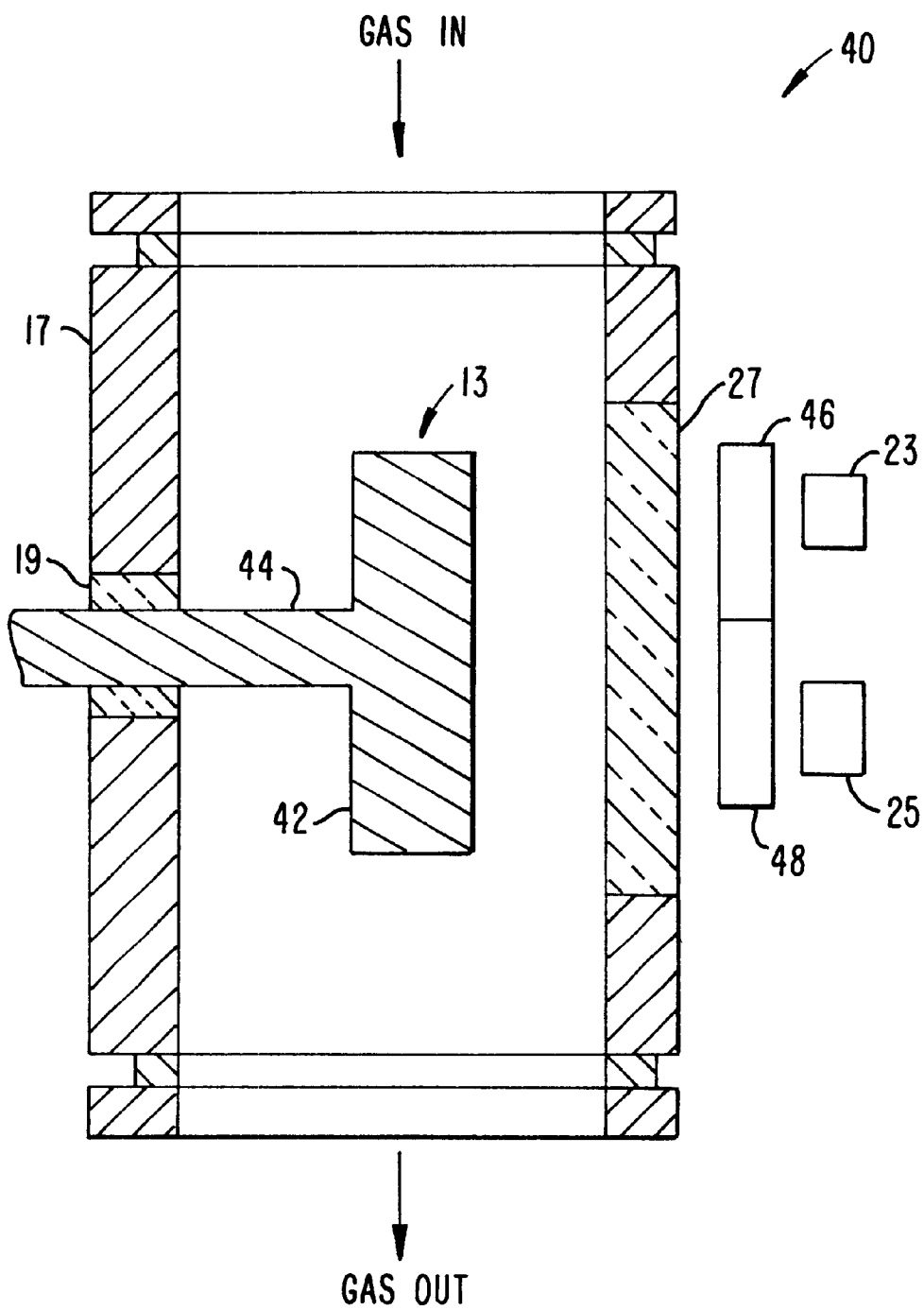
FIG. 2B is a simplified cross-section of an in-line plasma cell.

FIG. 2B is a simplified cross section of the plasma cell 40 shown in FIG. 1B. The cathode 13 has a co-axial portion 42 and a transverse portion 44, and is electrically insulated from the plasma cell wall 17 by an isolator 19. The cathode and the plasma cell wall are machined from aluminum alloy. The window 27 is made from single-crystal alumina, commonly called sapphire, but could be other material, such as fused silica, commonly called "quartz". The window material is chosen to be compatible with the constituents of the plasma effluent stream and transmissive of the optical emissions of interest. Filters 46, 48 are placed between the window and optical sensors 25, 23 to select the frequencies of interest from the optical emissions of the plasma formed in the plasma cell from the effluent stream. Alternatively, a sensor could provide a signal to an optical spectrum analyzer, which could analyze several frequencies of the unfiltered optical emissions. Although two filters and sensors are shown, more or less sensors and filters could be employed.

Figure 2C:
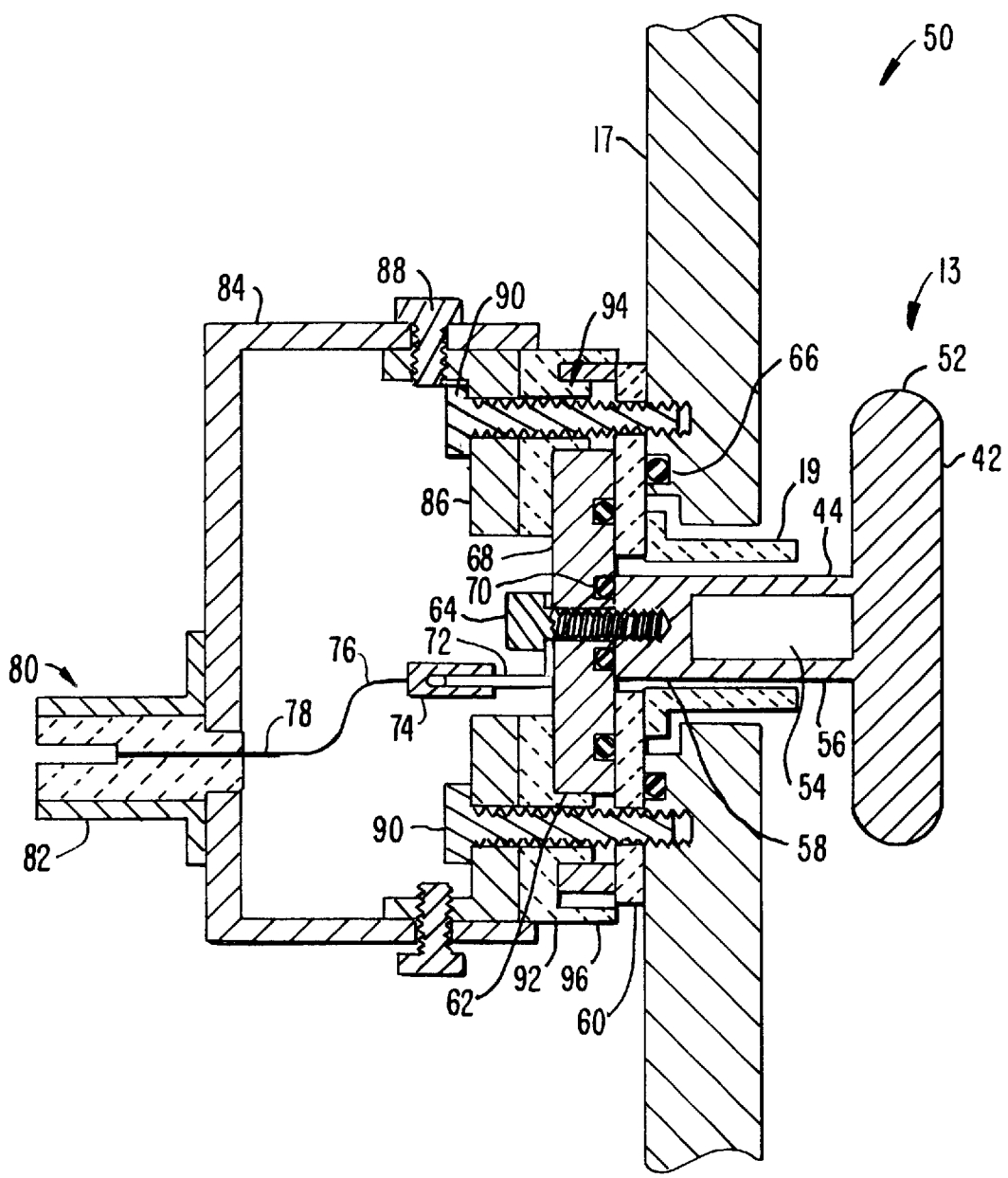
FIG. 2C is a cross-section of a portion of the plasma cell shown in FIG. 2B.

FIG. 2C is cross section of a portion 50 of the plasma cell shown in FIG. 2B. The co-axial portion 42 of the cathode 13 is solid with rounded ends 52. The rounded ends reduce plasma erosion that might otherwise occur if the co-axial portion had squarecut ends. The transverse portion 44 of the cathode is partially hollow 54 with a relatively thin wall 56. The thin wall increases the thermal resistance between the co-axial portion 42 of the cathode and the base 56 of the cathode.

The isolator 19 is made of alumina ceramic and isolates the cathode 13 from the plasma cell wall 17. An insulator plate 60 made of polytetrafluoroethelyene, such as TEFLON®, insulates the aluminum cathode plate 62 from the wall 17 of the plasma cell. Polytetrafluoroethelyene is a desirable material for use in systems in which the effluent, and hence the plasma formed in the plasma cell, contains fluorine. A screw 64 mechanically and electrically connects the base 58 of the cathode to the cathode plate 62. O-rings 66, 68, 70 form seals that prevent the effluent or plasma from corroding electrical connections or escaping from the plasma cell.

A lug connector 72 is attached to the cathode plate 62 with the screw. A slide-on connector 74 attached to a wire 76 electrically connects the lug connector 72 to the center conductor 78 of a BNC connector 80. The outer conductor 82 of the BNC connector is electrically coupled to a cover plate 84, which is in turn electrically coupled to a pressure plate 86 through cover screws 88 and then to the wall 17 of the plasma cell through metal screws 90. The screws 90 hold the metal pressure plate 86 against an insulating spacer 92. The insulating spacer is made of acetyl resin, but could be made from any of a variety of electrically insulating materials. The insulating spacer has shoulders 94 that isolate the screws 90 from the cathode plate 62, and a collar 96 that covers the edge of the cathode plate when assembled.

Figure 2D:
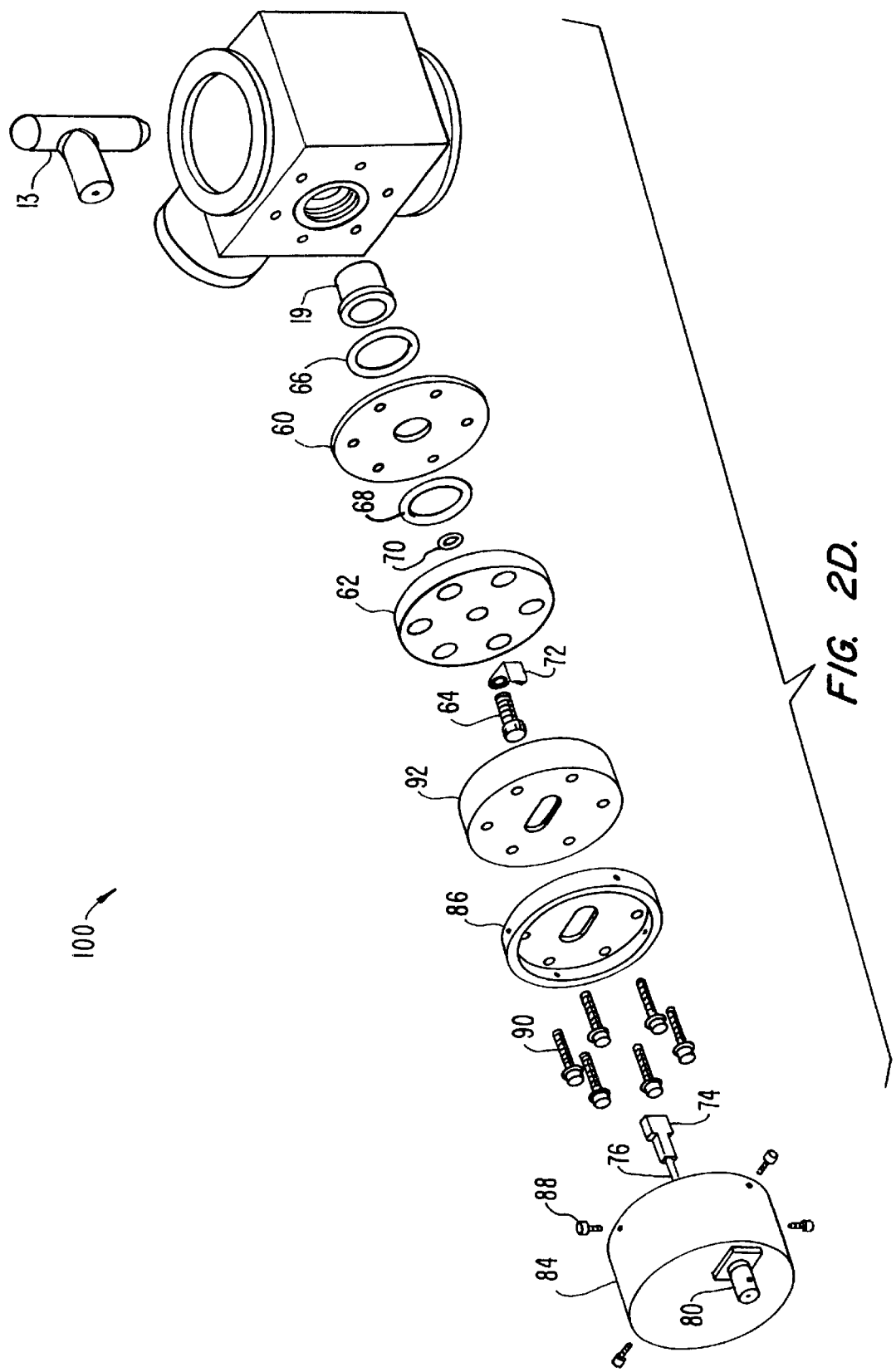
FIG. 2D is a simplified exploded view of a co-axial plasma cell.

FIG. 2D is a simplified exploded view of a co-axial plasma cell 100.

Figure 3A:
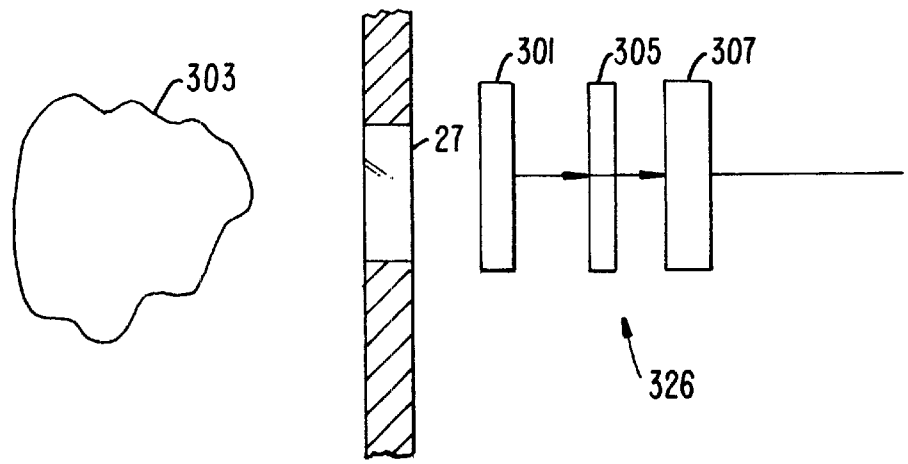
FIG. 3A is a simplified diagram of a sensor with a single detector according to one embodiment of the present invention.

FIG. 3A is a simplified representation of a sensor 326. The sensor can include an optical objective 301 to collect light through the window 27 from the glow discharge region 303. In a preferred embodiment, the optical objective 301 is not necessary due to the proximity of the window 27 to the glow discharge 303. In either embodiment, the light passes through the window 27 and through a filter 305 onto a detector 307. The detector can be any of a number of optical sensors, such as a phototransistor or photodiode. Although desirable in order to simplify data interpretation, it is not necessary for the sensor response to be linear. The filter is a band-pass filter centered at the wavelength of interest. The sensor may be placed directly outside of the window 27 in the foreline 18, or an optical pipe or fiber optic cable (not shown) can convey the light produced by the glow discharge to a remote location, thus conserving space around the process chamber.

Figure 3B:
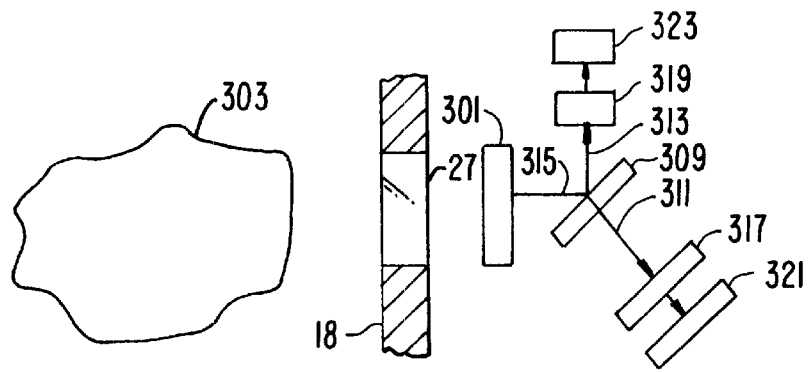
FIG. 3B is a simplified diagram of a sensor with two detectors according to another embodiment of the present invention.

FIG. 3B is a simplified representation of a dual-detector sensor. A beam splitter 309 splits the light collected by the optical objective 301 into a first beam 311 and a second beam 313. The beam intensities are approximately equal, each being about half the intensity of the input beam 315, but could be different intensities depending on, for example, the sensitivity of the sensors, particularly at the wavelengths of interest, and the strength of the emitted light at the wavelengths of interest. Filters 317, 319 are placed between the first beam 311 and a first detector 321 and the second beam 313 and a second detector 323 so that each detector responds to a different wavelength of light. One of the detectors can be used to monitor an indicator wavelength while the other is used to measure a wavelength characteristic of background radiation, or each detector can be used to monitor wavelengths of different indicators. Alternatively, the background radiation can be monitored with a broad-band detector without a filter to monitor the overall brightness of the glow discharge, to insure proper operation of the plasma cell or to normalize the indicator signal strength, for example.

Figure 3C:
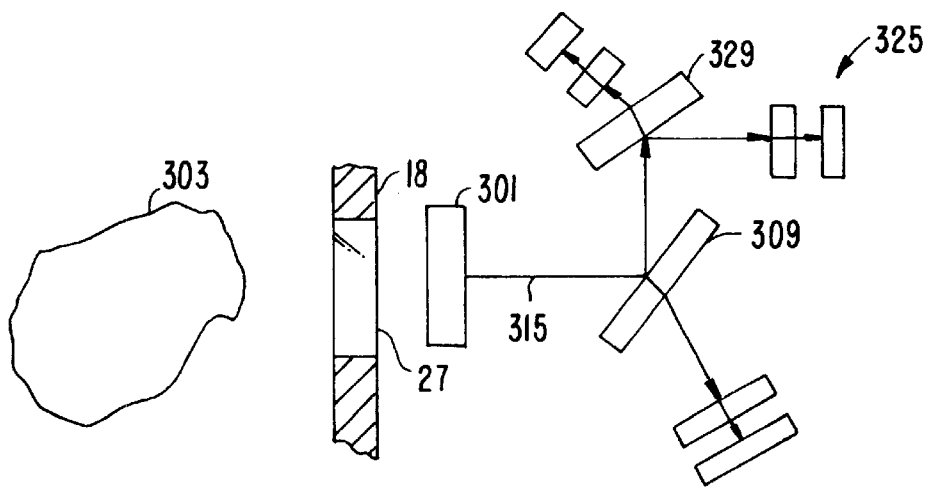
FIG. 3C is a simplified diagram of a sensor with multiple detectors according to another embodiment of the present invention.

FIG. 3C is a simplified diagram of a sensor 325 with multiple detectors. The first beam splitter 309 splits the input light beam 315 into multiple beams that are then split by a second beam splitter 329 into additional beams. The transmission and reflection characteristics of each beam splitter may be tailored according to the wavelengths and intensities of the peaks to be monitored, as well as the sensitivity characteristics of the sensors.

III. A PLASMA CELL USED IN CONJUNCTION WITH A REMOTE PLASMA GENERATOR

Figure 4:
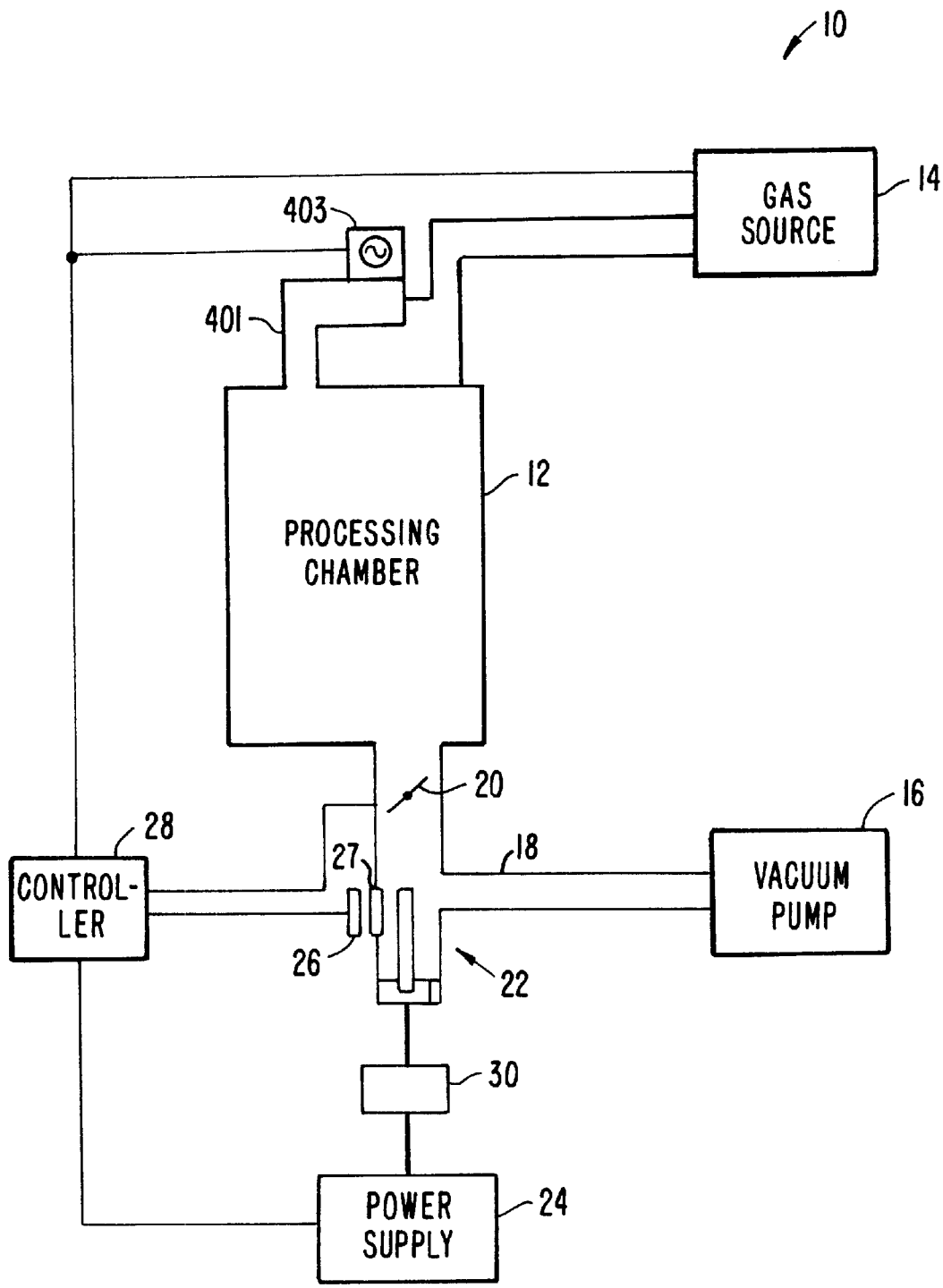
FIG. 4 is a simplified diagram of a processing system with a remote plasma generator and an effluent plasma cell according to an embodiment of the present invention.

FIG. 4 is another embodiment of the present invention. A gas source 14 provides a precursor, such as $C_2F_6$, $CF_4$, or $NF_3$, to a remote microwave plasma generator 401. The microwave plasma generator uses a microwave source 403, such as a magnetron, to convert the precursor into a plasma that contains free fluorine radicals and other plasma species, which are conveyed into the processing chamber 12. The glow discharge region of the remote plasma is generally confirmed to the remote plasma generator. The fluorine radicals combine with residue in the chamber, such as silicon oxide, to form volatile compounds, such as silicon-fluorides, that are removed through the exhaust system. A typical microwave plasma generator operates at 2.45 GHz and is very efficient at breaking down the precursor and generating chemically active fluorine radicals. This is especially important if the precursor is fairly stable, and difficult to dissociate at the lower frequencies used to form in-situ plasmas. It is estimated that a microwave plasma generator dissociates up to 99.99% of $NF_3$ precursor, for example, into desired species. This efficiency not only improves cleaning efficiency, but also simplifies management of the chamber effluent, as it is generally desirable to limit the emissions of precursor gases, which add to global warming via the greenhouse effect.

IV. EXPERIMENTAL RESULTS

Figure 5A:
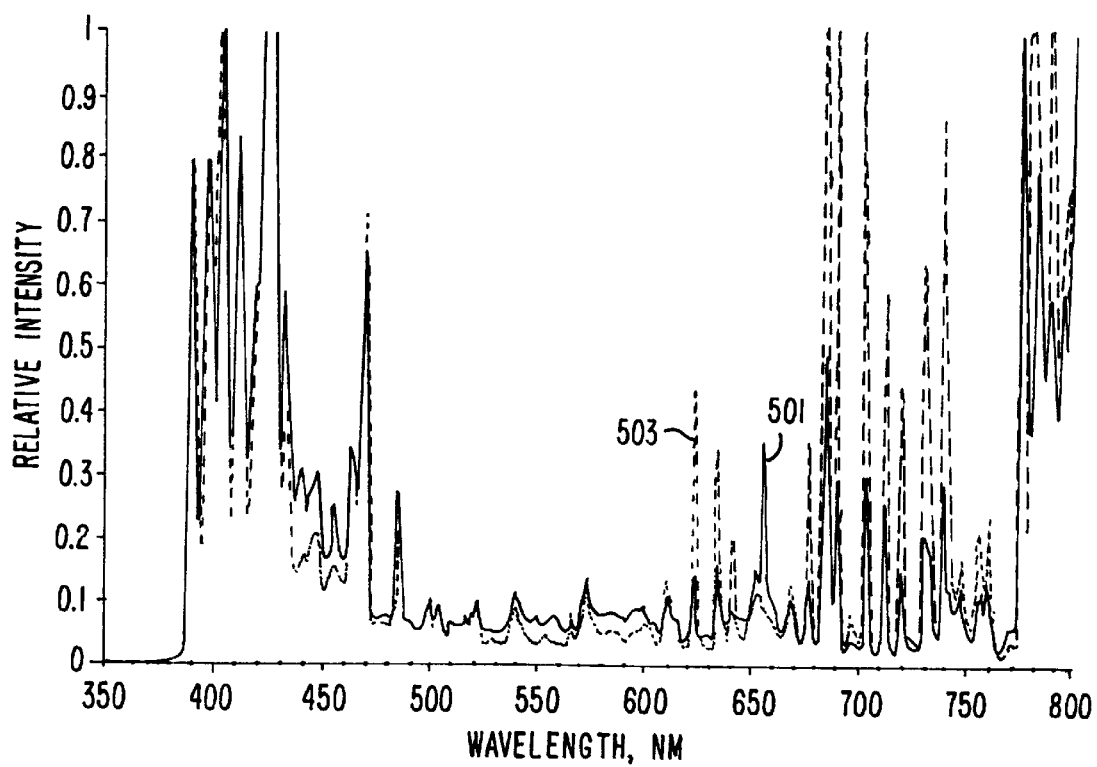
FIG. 5A is a graph of relative intensities versus wavelength of emissions from an effluent plasma before and after a chamber cleaning process.

FIG. 5A shows the optical emission spectrum of effluent during a remote plasma clean of a chamber with silicon oxide residue using $NF_3$ gas as the precursor. A 10,000 Å thick layer of silicon oxide was formed in the chamber from tetraethylorthosilane (TEOS) using a plasma-enhanced CVD process. A first emissions curve 501 represents the emissions at the beginning of the cleaning process. A second emissions curve 503 represents the emissions at the end of the cleaning process.

Figure 5B:
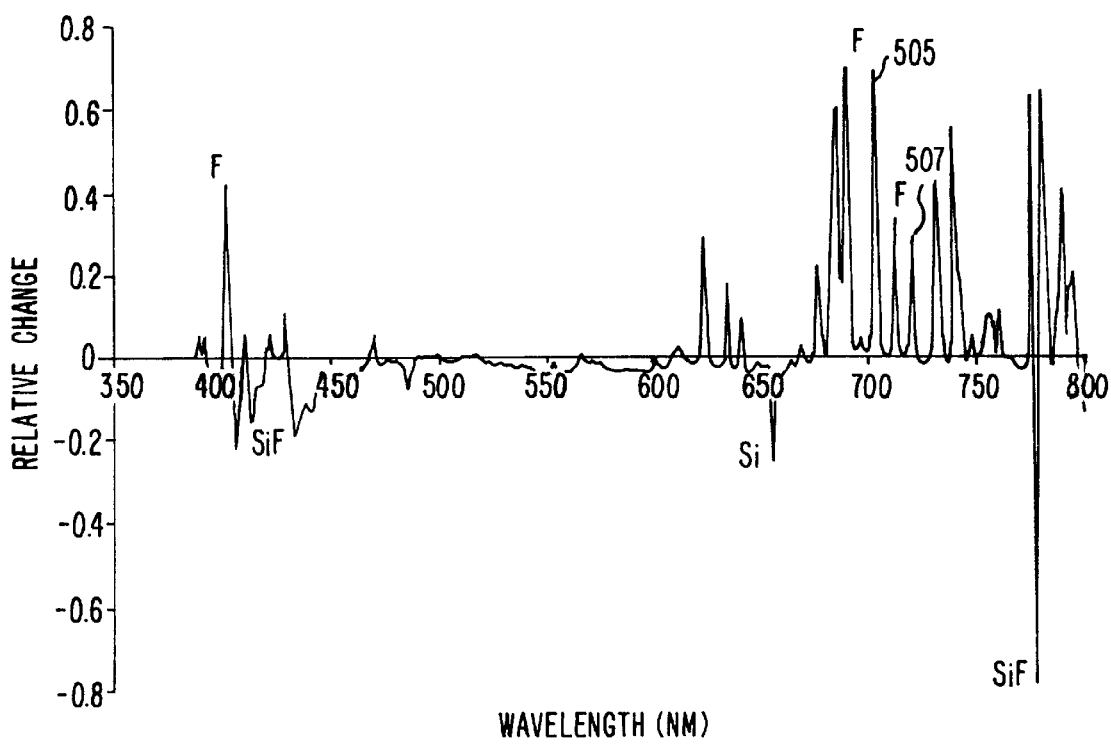
FIG. 5B is a graph of the difference in intensity of emissions versus wavelength from an effluent plasma.

FIG. 5B shows the relative change in emission spectra between the start and end of the remote plasma cleaning process. This figure suggests several wavelengths for detecting the endpoint of the cleaning process. The peaks at 440 and 778 nm correspond to SiF and the peak at 704 nm corresponds to atomic fluorine, F. During the cleaning process, the fluorine combines with silicon oxide residue in the chamber to create $SiF_x$, which is removed from the chamber via the exhaust system. The cleaning reaction consumes F from the system as $SiF_x$ is formed, but after the silicon oxide residue has been cleaned by the F, the concentration of F in the exhaust stream increases. This increase in F concentration was used to detect the endpoint of the cleaning process. Choosing a peak that starts low and ends high improves the signal-to-noise ratio of the peak during the end point of the operation. If a peak corresponding to $SiF_4$ were used, then the monitored concentration would start off high and then decrease as the chamber was cleaned. Other peaks might be appropriate depending on the particular chamber chemistry.

Figure 6:
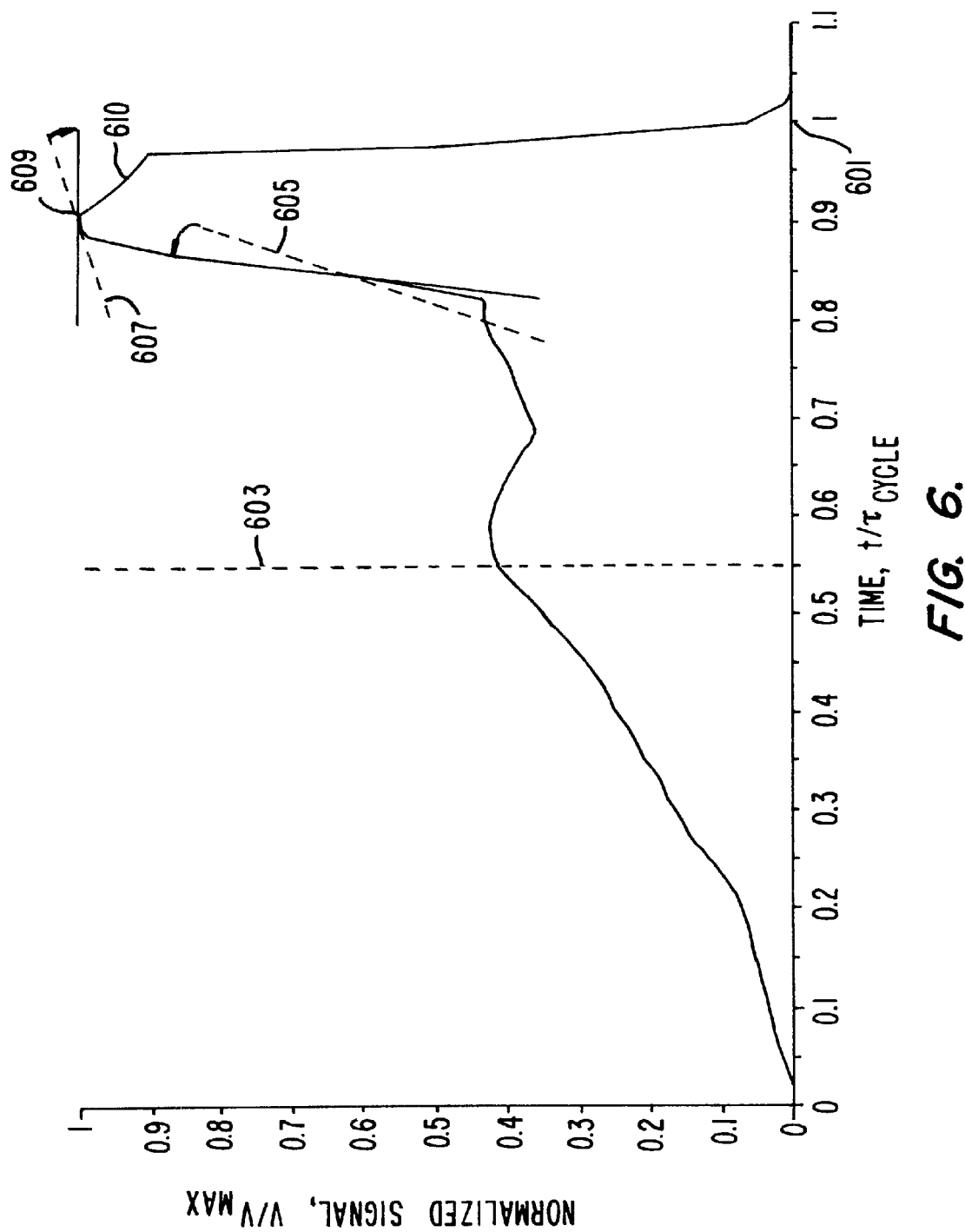
FIG. 6 is a graph of the intensity of a selected wavelength of emissions of an effluent plasma during a chamber cleaning process versus normalized time.

FIG. 6 shows the normalized signal intensity of the fluorine peak detected by the optical sensor during a cleaning experiment. The criteria for determining the endpoint 601 of the cleaning process were that the endpoint must occur after a minimum time 603, the rate of change (slope) of the signal must rise above a first predetermined level 605, and the rate of change of the signal must subsequently fall below a second predetermined level 607. The first predetermined level of the slope indicates the increase in fluorine levels in the effluent from the chamber, and the second predetermined level of the slope indicates that the fluorine concentration has reached a steady state. Normally, the remote plasma source and cleaning precursor gas would be turned off when the fluorine concentration reaches a steady state, but some processes may "overetch" the chamber by maintaining cleaning plasma for an additional period of time. In this experiment, conditions were maintained for an overetch period 610, after which time the remote plasma was shut off.

This type of endpoint detection method has several advantages over conventional endpoint methods, such as visual inspection or fixed-time methods, because the present invention determines when the effectiveness of the cleaning plasma actually drops off. With a visual inspection method, for example, monitoring a portion of the chamber that is not significantly being cleaned by the plasma may cause the cleaning process to be maintained for a longer period than necessary. This would not only unduly disrupt product flow, it would also increase the use, and hence the cost and potential PFC emissions associated with the precursor gas. Fixed-time cleans, on the other hand, can result in under-cleaning if there is a change in cleaning conditions or hardware (e.g., the precursor breakdown efficiency drops due to aging of the magnetron typically used in a remote microwave plasma generator).

In addition to determining the endpoint of a cleaning process, monitoring effluent from a processing chamber can also be used in a number of different ways. For example, it would be desirable to know if the power output of the magnetron or the efficiency of the remote plasma generator changed. This result could be achieved by monitoring the effluent stream to detect unconverted precursor, for example, which the plasma cell could excite to produce a characteristic emission, even if the plasma cell would not substantially dissociate the precursor into a plasma.

This type of detection method measures effluent from the entire processing chamber, and thus serves to provide information relating to the average conditions within the chamber. Methods that monitor a process from a point within the chamber must consider where the sensor is placed, resulting in additional uncertainties. By incorporating information from the entire chamber volume, the present method provides a more robust indication of chamber conditions.

Figure 7:
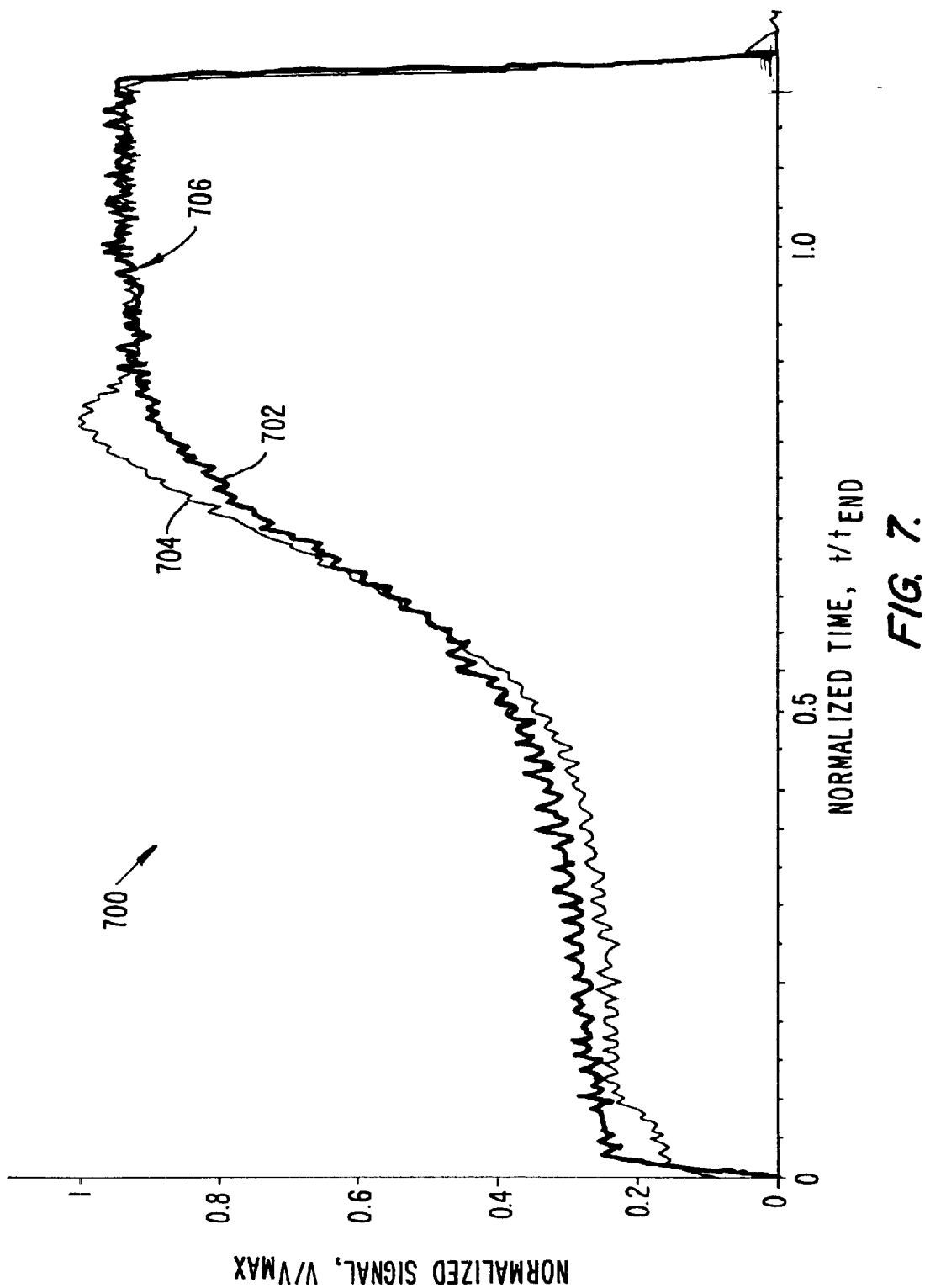
FIG. 7 is a graph showing the effect of detector placement on the response of the detector during a cleaning process.

FIG. 7 is a graph 700 showing the effect of detector placement on the response of the detector during RF plasma cleaning operations. The first curve 702 shows the output of an optical detector of a plasma cell 701 placed in the effluent stream of a processing system during the RF plasma cleaning process. The second curve 704 shows the output of a conventional optical detector monitoring the optical emissions of an in-situ plasma through a window in the processing chamber. Both curves are normalized to the maximum output of the respective detector and the x-axis is normalized to the overall cleaning time for each curve. The similarity of the curves, particularly at the endpoint of the cleaning process 706, indicates that a downstream plasma cell can be substituted for a conventional detector that monitors the in-situ plasma through a chamber window for this type of cleaning process.

Figure 8A:
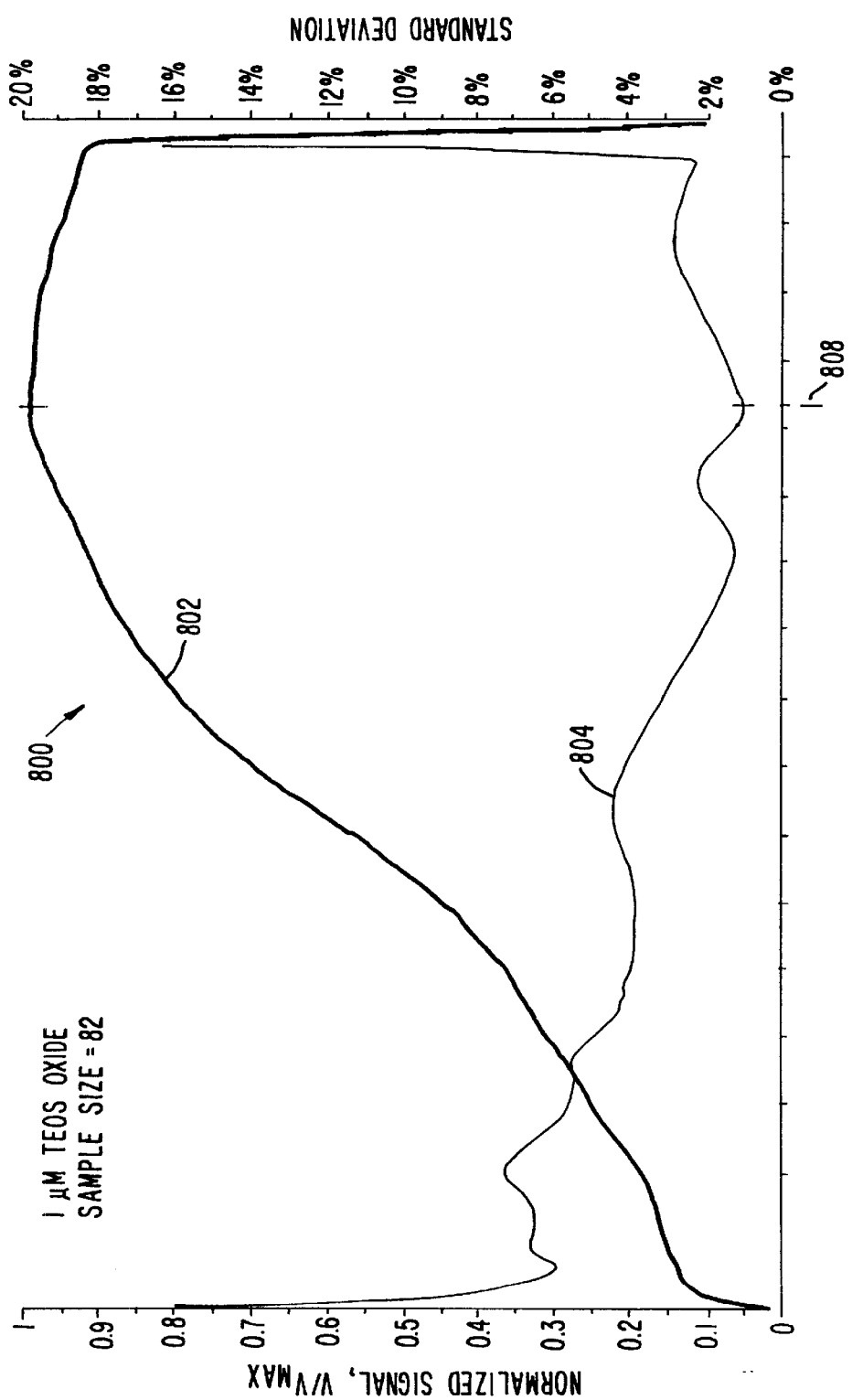
FIG. 8A is a graph illustrating the repeatability of a downstream plasma cell over several cleaning operations.

FIG. 8A is a graph 800 illustrating endpoint detector repeatability for a downstream plasma cell. The first curve 802 shows the normalized signal output from a detector in a downstream plasma cell during a plasma clean process. A layer of silicon oxide approximately 1 μm thick was formed in the chamber prior to each cleaning process. The silicon oxide was formed using TEOS as a silicon source. The deposition and cleaning was repeated 82 times. The second curve 804 shows the standard deviation of the signal output over the 82 tests. The standard deviation of the signal output is very small, less than 2% 806, at the endpoint 808 of the cleaning process, indicating low variability of the endpoint detection.

Figure 8B:
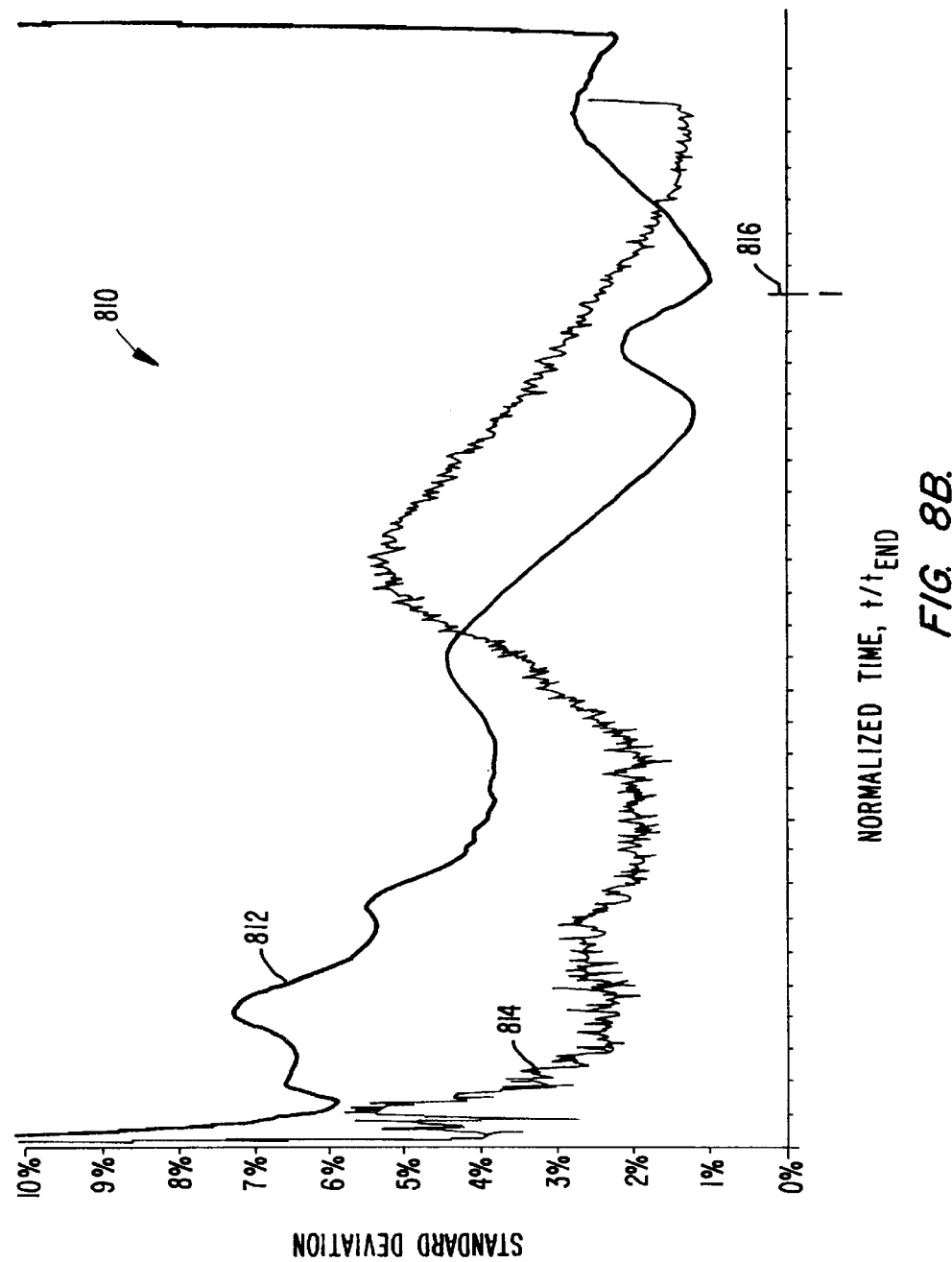
FIG. 8B is a graph showing the effect RF frequency of the plasma cell has on the repeatability of detector output.

FIG. 8B is a graph 810 showing the standard deviations of the detector output during a series of clean operations using different RF frequencies for the downstream plasma cell. The first trace 812 shows the standard deviation of 82 samples of the detector output of a downstream plasma cell powered at 31 kHz by an electronic ballast during a chamber cleaning process. The second trace 814 shows the standard deviation of 10 samples of the detector output of a downstream plasma cell powered at 350 kHz by an RF generator. At the endpoint 816, both curves show a standard deviation less than 5%, which is an acceptable deviation for some processes; however, the electronic ballast is about two orders of magnitude less expensive than the RF generator. Plasma cell electrode erosion is worse at lower frequencies. Therefore, even though a lower-frequency generator may be less expensive, it is desirable to more closely match the surface area of the cathode to the surface area of the anode, and to provide larger-area electrodes, when using a lower-frequency generator to power a plasma cell.

Figure 9:
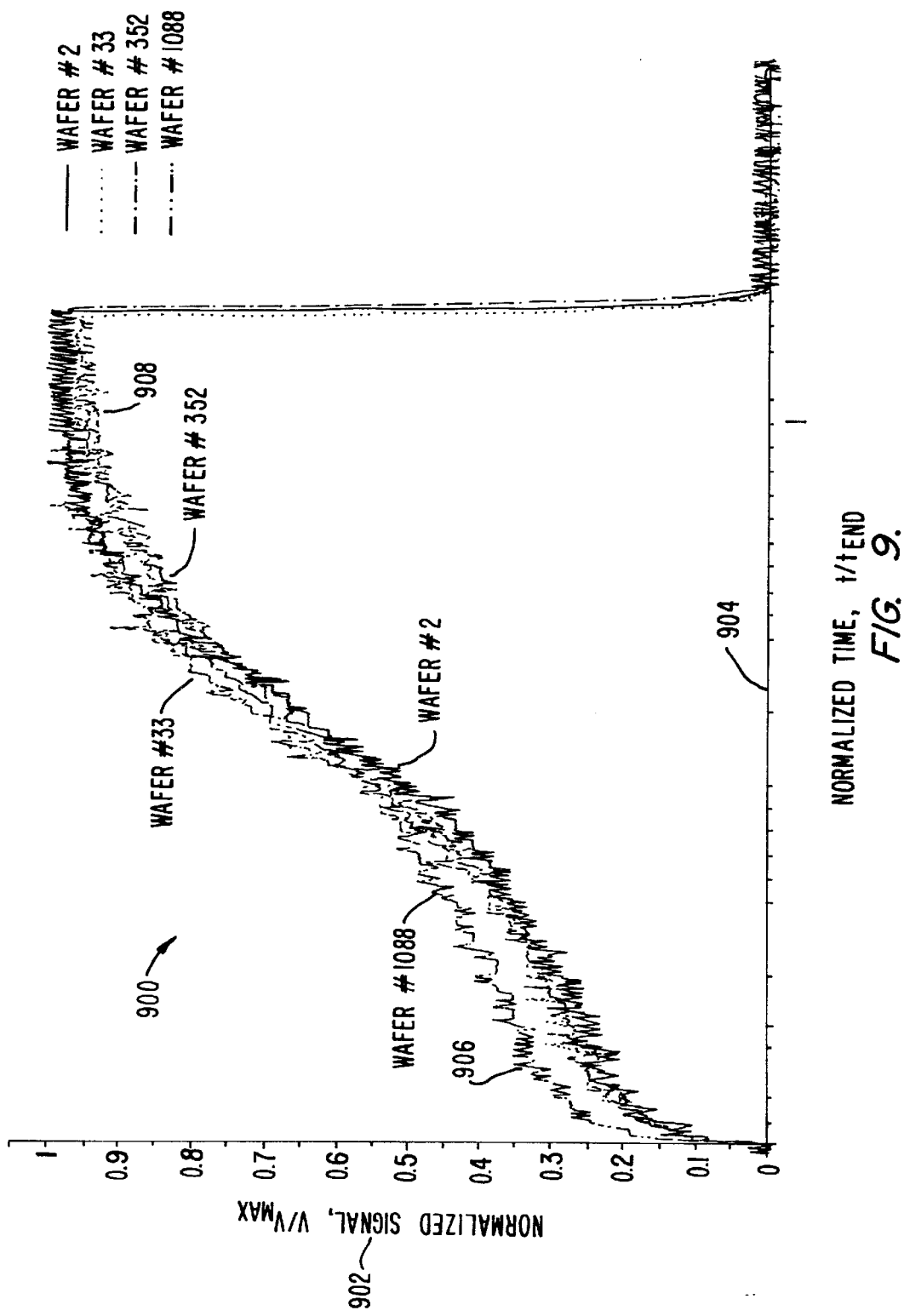
FIG. 9 is a graph illustrating the reliability of a downstream plasma cell when used to determine the endpoint in over one thousand cleaning operations.

FIG. 9 is a family of curves 900 illustrating the burn-in data for the normalized output of a plasma cell 902 over a normalized cleaning process time 904 for 1,335 wafers. The spread between the curves fluctuates over the normalized time period, but although the spread is relatively large near the beginning 906 of the cleaning process period, the spread is relatively small at the endpoint 908 of the cleaning process, where repeatability is more important. Therefore, it is expected that a downstream plasma cell can reliably indicate the end of a cleaning process for over one thousand cleaning cycles.

The invention has now been described with reference to the preferred embodiments and specific examples. Alternatives and substitutions will now be apparent to persons of skill in the art. For example, the processing chamber could be a PECVD or PVD chamber or the plasma cell and sensor may be placed in different locations or configurations. Multiple sensors may be configured in a variety of ways, including by providing multiple windows around the glow discharge region. Furthermore, the film to be cleaned during a cleaning process could be silane-based silicon oxide, silicon nitride, metal, semiconductor material, or other material. Accordingly, the above description is not intended to limit the invention as provided in the following claims.

What is claimed is:

1. A method for controlling a process parameter of a substrate processing system, the method comprising steps of:

(a) flowing a gas into a processing chamber, the process parameter being at a first value;

(b) evacuating effluents from the processing chamber;

(c) flowing the effluents through a plasma cell comprising a cathode having a first portion and a second portion, wherein said flow of effluents through said plasma cell is transverse to said first portion of said cathode and substantially parallel to said second portion of said cathode;

(d) forming a plasma in the plasma cell from the effluents by applying energy to the cathode;

(e) detecting photo emissions of a selected wavelength from the plasma; and (f) changing the process parameter to a second value in response to a change in the photo emissions.

2. The method of claim 1 wherein the process parameter is a power supplied to a remote plasma generator.

3. The method of claim 1 wherein the process parameter is a gas flow rate.

4. The method of claim 1 wherein a second process parameter is controlled in response to a second selected wavelength.

5. A method for cleaning residue from a processing chamber, the method comprising steps of:

(a) forming a remote plasma from a fluorine-containing precursor in a remote plasma generator;

(b) transporting reactive species from the remote plasma into the processing chamber;

(c) evacuating effluents from the processing chamber in an exhaust stream;

(d) flowing the effluents through a plasma cell comprising a cathode having a first portion and a second portion wherein said flow of effluents through said plasma cell is transverse to said first portion of said cathode and substantially parallel to said second portion of said cathode;

(e) forming a second plasma from the effluents in the plasma cell by applying energy to the cathode;

(f) monitoring an intensity of a selected wavelength produced by the second plasma to determine a change of intensity; and (g) extinguishing the remote plasma into the processing chamber after a selected change of intensity has occurred.

6. The method of claim 5 wherein the residue comprises silicon oxide formed from a tetraethylorthosilane-based chemical-vapor-deposition process.

7. The method of claim 5 wherein the residue comprises silicon oxide formed from a silane-based chemical-vapor deposition process.

8. The method of claim 5 wherein the residue comprises silicon nitride.

9. The method of claim 5 wherein the residue comprises semiconductor material.

10. The method of claim 5 wherein the residue comprises a metal.

11. The method of claim 5 wherein the selected wavelength indicates a free fluorine concentration.

12. An apparatus for determining a composition of effluent exhausted through an exhaust line of a vacuum chamber, the apparatus comprising:

a gas source configured to supply a gas to the vacuum chamber;

a vacuum pump configured to produce an exhaust stream of effluent from the vacuum chamber;

a plasma cell disposed between the vacuum chamber and the vacuum pump, wherein the plasma cell comprises:

(a) an electrically conductive sidewall that at least partially defines a gas passageway through the plasma cell, (b) a gas inlet and a gas outlet that can be coupled to the exhaust line to allow gas flow through the plasma cell from the gas inlet, through the gas passageway and out the gas outlet, and (c) a cathode positioned inside the gas passageway and insulated from the sidewall, the cathode having first and second portions wherein when the plasma cell is coupled to the exhaust line, the first portion is transverse to gas flow through the passageway and the second portion is substantially parallel to gas flow through the gas passageway;

a power supply electrically coupled to the plasma cell; and a sensor configured to detect light produced by a plasma formed in the plasma cell.

13. The apparatus of claim 10 further comprising an optical filter disposed between the plasma cell and the sensor.

14. The apparatus of claim 10 wherein the sensor provides a signal to an optical spectrum analyzer.

15. The apparatus of claim 10 further comprising a window configured to provide light emitted from the plasma to the sensor.

16. The apparatus of claim 10 wherein the power supply is a switching power supply.

17. The apparatus of claim 10 wherein the plasma cell includes an electrode coaxial with a portion of a wall of a vacuum conduit.

18. The apparatus of claim 10 further comprising a plurality of sensors configured to detect a plurality of selected wavelengths of light.

19. A plasma cell that can be operatively coupled to an exhaust line of a substrate processing chamber, the plasma cell comprising:

an electrically conductive sidewall that at least partially defines a gas passageway through the plasma cell;

a gas inlet and a gas outlet that can be coupled to the exhaust line to allow gas flow through the plasma cell from the gas inlet, through the gas passageway and out the gas outlet;

a cathode positioned inside the gas passageway and insulated from the sidewall, the cathode having first and second portions wherein when the plasma cell is coupled to the exhaust line the first portion is transverse to-gas flow through the gas passageway and the second portion is substantially parallel to gas flow through the gas passageway; and a sensor configured to detect radiation emitted from a plasma formed in the plasma cell.

20. The plasma cell of claim 19 wherein the second portion of the cathode has a rounded first end extending towards the gas inlet.

21. The plasma cell of claim 20 wherein the second portion of the cathode has a rounded second end extending towards the gas outlet.

22. The plasma cell of claims 19 wherein the second portion of the cathode is solid.

23. The plasma cell of claim 19 wherein the first portion of the cathode is partially hollow.

24. The plasma cell of claim 19 wherein the first portion of the cathode is partially hollow and the second portion of the cathode is solid and has a rounded first end extending towards the gas inlet and a rounded second end extending towards the outlet.

25. The plasma cell of claim 19 wherein the cathode is insulated from the sidewall by a ceramic spacer.

26. The plasma cell-of claim 19 wherein the sidewall can be electrically grounded and the cathode is configured to be operatively coupled to a power supply.

27. The plasma cell of claim 19 wherein the plasma cell further comprises a window and the sensor is positioned opposite the window and outside the gas passageway.

28. The plasma cell of claim 19 wherein the elongated portion of the cathode has a rounded first end extending towards the gas inlet.

29. A plasma cell that can be operatively coupled to an exhaust line of a substrate processing chamber, the plasma cell comprising:

an electrically conductive sidewall that at least partially defines a gas passageway through the plasma cell;

a gas inlet and a gas outlet that can be coupled to the exhaust line to allow gas flow through the plasma cell from the gas inlet, through the gas passageway and out the gas outlet;

a cathode having an elongated portion inside the gas passageway, wherein when the plasma cell is coupled to the exhaust line the elongated portion is substantially parallel to gas flow through the gas passageway; and a sensor configured to detect radiation emitted from a plasma formed in the plasma cell.

30. A plasma cell of claim 29 wherein the cathode is insulated from the sidewall by a ceramic spacer.

31. A plasma cell of claim 29 wherein the sidewall can be electrically grounded and the cathode is configured to be operatively coupled to a power supply.

32. A plasma cell of claim 29 wherein the plasma cell further comprises a window and the sensor is positioned opposite the window and outside the gas passageway.

33. A method for controlling a process parameter of a substrate processing system, the method comprising:

(a) flowing a gas into a processing chamber, the process parameter being at a first value;

(b) evacuating effluents from the processing chamber;

(c) flowing the effluents through a plasma cell comprising a cathode having an elongated portion, wherein said flow of effluents through said plasma cell is substantially parallel to said elongated portion of said cathode;

(d) forming a plasma in the plasma cell from the effluents by applying energy to the cathode;

(e) detecting photo emissions of a selected wavelength from the plasma; and (f) changing the process parameter to a second value in response to a change in the photo emissions.

34. A method for cleaning residue from a process chamber, the method comprising:

(a) forming a remote plasma from a fluorine-containing precursor in a remote plasma generator;

(b) transporting reactive species from the remote plasma into the processing chamber;

(c) evacuating effluents from the processing chamber in an exhaust stream;

(d) flowing the effluents through a plasma cell comprising a cathode having an elongated portion, wherein said flow of effluents through said plasma cell is substantially parallel to said elongated portion of said cathode;

(e) forming a second plasma from the effluents in the plasma cell by applying energy to the cathode;

(f) monitoring an intensity of a selected wavelength produced by the second plasma to determine a change of intensity; and (g) extinguishing the remote plasma after a selected change of intensity has occurred.

* * * * *